(12) United States Patent
Chen et al.

(10) Patent No.: US 6,303,498 B1
(45) Date of Patent: Oct. 16, 2001

(54) METHOD FOR PREVENTING SEED LAYER OXIDATION FOR HIGH ASPECT GAP FILL

(75) Inventors: Sheng-Hsiung Chen, Taichung; Ming-Hsing Tsai, Taipei, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/378,497

(22) Filed: Aug. 20, 1999

(51) Int. Cl.⁷ ................................................ H01L 21/44
(52) U.S. Cl. ......................... 438/675; 438/677; 438/687
(58) Field of Search ............................. 438/584, 637, 438/643, 644, 653, 654, 678, 687

(56) References Cited

U.S. PATENT DOCUMENTS

| | | | |
|---|---|---|---|
| 5,112,448 | 5/1992 | Chakrovorty | 205/118 |
| 5,127,986 * | 7/1992 | August | 156/643 |
| 5,266,446 | 11/1993 | Chang et al. | 430/314 |
| 5,436,504 | 7/1995 | Chakravorty et al. | 257/758 |
| 5,462,897 | 10/1995 | Baum et al. | 437/230 |
| 5,824,599 * | 10/1998 | Schacham-Diamand | 438/678 |
| 5,898,222 | 4/1999 | Farooq et al. | 257/762 |
| 5,899,740 | 5/1999 | Kwon | 438/627 |
| 5,907,790 * | 5/1999 | Kellam | 438/666 |
| 5,968,333 * | 10/1999 | Nogami | 205/184 |
| 5,969,422 * | 10/1999 | Ting | 257/762 |
| 6,001,730 * | 12/1999 | Farkas | 438/627 |
| 6,037,258 * | 3/2000 | Liu | 438/687 |
| 6,054,398 * | 4/2000 | Pramanick | 438/784 |
| 6,080,669 * | 6/2000 | Lacoponi | 438/672 |
| 6,100,181 * | 8/2000 | You | 438/633 |
| 6,126,806 * | 10/2000 | Uzoh | 205/182 |

* cited by examiner

Primary Examiner—Mary Wilczewski
Assistant Examiner—David J Goodwin
(74) Attorney, Agent, or Firm—George O. Saile; Stephen B. Ackerman

(57) ABSTRACT

A new method is provided whereby a copper seed layer is deposited over a barrier layer of TaN. Under the first embodiment of the invention, a doped seed layer is deposited over the barrier layer. Under the second embodiment of the invention a thin layer of metal is deposited over a seed layer of pure copper thereby preventing oxidation of the copper seed layer.

18 Claims, 2 Drawing Sheets

METHOD FOR PREVENTING SEED LAYER OXIDATION FOR HIGH ASPECT GAP FILL

BACKGROUND OF THE INVENTION

(1) Field of the Invention

The invention relates to the fabrication of integrated circuit devices, and more particularly, to a method of avoiding the shadowing effect of the deposited copper seed layer that is deposited in a high aspect ratio opening.

(2) Description of the Prior Art

The conventional method of forming conducting lines and connecting vias within the construct of a semiconductor device is to deposit a layer of conducting material, such as aluminum, on the surface of a semiconductor using for instance a sputtering technique. Over this layer of conducting material is deposited a layer of photoresist, this photoresist is patterned and etched such that the conducting material that is to stay in place (to form the conducting lines or vias) is covered or protected by the photoresist. The unwanted conducting material is then removed, typically using anisotropic plasma etch. The openings created by the removal of the conducting material are filled with a dielectric material such as an oxide. The surface of the combined patterns of conductive material and dielectric can further be planarized by using a Chemical Mechanical Polishing (CMP) process that completes the creation of conducting lines or vias.

The continuous effort to improve semiconductor device performance brings with it a continuous effort of scaling down device feature sizes thereby improving the device performance speed and its functional capability. With the reduction in device feature sizes, the performance of the device becomes increasingly more dependent on the interconnections that are required between functional devices. In order to improve the interconnect aspect of semiconductor design and to reduce the relative impact of the device interconnects, integrated circuits are typically fabricated using multiple level interconnect schemes. Semiconductor devices are therefore often mounted on multi-chip modules such as polyimide substrates that contain buried wiring patterns to conduct electrical signals between various chips. The multiple layers of interconnect metalization contained within these multi-chip modules are typically separated by alternating layers of an isolating dielectric, the layers of dielectric serve as electrical isolation between the metal features. The metal that is used to construct the interconnect metal features is selected based on such performance characteristics as low resistivity, resistance to electromigration, adhesion to the underlying substrate material, stability (both electrical and mechanical) and ease of processing. For these reasons copper is often selected due to its low resistivity, high electromigration resistance and stress voiding resistance. Copper does however suffer from high diffusivity in common insulating materials such as silicon oxide and oxygen-containing polymers. For instance, copper tends to diffuse into polyimide during high temperature processing of the polyimide causing severe corrosion of the copper and the polyimide due to the copper combining with oxygen in the polyimide. This corrosion may result in loss of adhesion, delamination, voids, and ultimately a catastrophic failure of the component. A copper diffusion barrier is therefore often required.

Low resistivity metals such as aluminum and copper and their binary and ternary alloys have been widely explored as fine line interconnects in semiconductor manufacturing. The emphasis on scaling down line width dimensions in Very Large Scale Integrated (VLSI) and Ultra Large Scale Integrated (USLI) circuitry manufacturing has led to reliability problems including inadequate isolation, electromigration, and planarization. The damascene and dual damascene processes are important design approaches for VLSI/ULSI metal interconnect technologies. These approaches use metal to fill vias and interconnect lines followed by chemical mechanical polishing (CMP) with various Al, Cu and Cu-based alloys. A key problem is the filling of high aspect ratio vias in a homogeneous manner while creating the desired profile for the filling and at the same time avoiding seams or other surface irregularities. Several promising techniques have been explored to address this problem such as Metallo-Organic Chemical Vapor Deposition (MOCVD) and laser melting technology. Problems remain however with low deposition rates while the in-situ deposition of thin lines is very difficult. Furthermore, high temperature bias sputtering (i.e. above 450 degrees C.) technique has been attempted but this technique has limitations below 1 um geometries while such high temperatures lead to degrading the underlying metals. Conventional Chemical Vapor Deposition (CVD) technology or plating has not yet been applied to creating interconnect metal where high aspect ratio openings are applied. Existing Physical Vapor Deposition (PVD) techniques are at this time also not available to adequately address this problem.

It is therefore clear that, as the density of circuit components contained within a semiconductor die has increased and the circuit components have decreased in size and are spaced closer together, it has become increasingly difficult to access selectively a particular region of the silicon wafer through the various layers that are typically superimposed on the surface of the silicon wafer without undesired interference with other active regions.

It is especially important to have a technology that can etch openings that have essentially vertical walls, most notably when the openings are to extend deeply into the surface layers. Additionally, to tolerate some misalignment in the masks used to define such openings, it is advantageous to provide protection to regions that need isolation but that inadvertently lie partially in the path of the projected opening. To this end it is sometimes the practice to surround such regions with a layer of material that resists etching by the process being used to form the openings. Accordingly, a technology that provides the desired results will need an appropriate choice both in the materials used in the layers and the particular etching process used with the materials chosen.

Dry etching, such as plasma etching and reactive ion etching, has become the technology of choice in patterning various layers that are formed over a silicon wafer as it is processed to form therein high density integrated circuit devices. This is because it is a process that not only can be highly selective in the materials it etches, but also highly anisotropic. This makes possible etching with nearly vertical sidewalls.

Basically, in plasma etching as used in the manufacturing of silicon integrated devices, a silicon wafer on whose surface have been deposited various layers, is positioned on a first electrode in a chamber that also includes a second electrode spaced opposite the first. As a gaseous medium that consists of one or more gasses is flowed through the chamber, an r–f voltage, which may include components at different frequencies, is applied between the two electrodes to create a discharge that ionizes the gaseous medium and that forms a plasma that etches the wafer. By appropriate choice of the gasses of the gaseous medium and the parameters of the discharge, selective and anisotropic etching is achieved.

Recent requirements for the creation of holes within deep layers of either conducting or other materials have resulted in creating openings that have aspect ratios in excess of 3. It is beyond the capability of the existing techniques to fill gaps of this aspect ratio with High Density Plasma-oxide (HDP-oxide). This lack of adequate filling of gaps also occurs for holes that have a reentrant spacer profile. A reentrant spacer profile is a profile where the walls of the openings are not vertical but are sloped, this sloping of the walls makes complete penetration of the HPD-oxide into the hole difficult and, under certain conditions, incomplete.

In a typical process of semiconductor IC fabrication, a contact/via opening is etched through an insulating layer. The contact opening connects to an underlying conductive area to which electrical contact is to be established. A glue layer, typically titanium, is conformally deposited within the contact/via opening. Next, a titanium nitride barrier is formed within the contact/via opening. This barrier layer may be deposited by reactive sputtering or by CVD. With increased reduction in device feature size, the CVD method of forming a barrier layer becomes essential. CVD processes are preferred because they can provide conformal layers of any thickness. Thinner barrier layers are preferred because of the shrinking feature sizes. A layer of conducting material, typically tungsten, is deposited within the contact/via opening to form a plug filling the contact/via opening. A second conducting layer, such as an aluminum alloy, is deposited over the tungsten plug and patterned to complete the metalization. Using a typical etchback process to form the tungsten plug, the thin CVD titanium nitride barrier layer may be etched away, exposing the underlying titanium layer. During the subsequent scrub cleaning process, the exposed titanium underlayer will be oxidized. This will result in difficulty in etching the titanium oxide layer causing metal interconnect shorting due to the residues remaining after etching. A typical glue layer can contain titanium and has a thickness of between about 100 and 400 Angstrom. A typical glue barrier layer (CVD deposited) can contain titanium and has a typical thickness of between about 50 and 400 Angstrom.

The invention addresses a process for filling high aspect ratio openings with copper by first depositing a thin layer of pure copper (as a seed layer) on top of the barrier layer of TaN. The layer of pure copper acts as a plating conductive layer and a nucleation layer. The minimum thickness of the seed layer is about 50 Angstrom, this thickness is required to achieve a reliable gap fill. The problem that is encountered with the deposition of the seed layer in openings that have a high aspect ratio is that the seed layer will not be evenly deposited over the sidewalls of the opening. The high aspect ratio causes a shadowing effect whereby the deposition of the seed layer on the sidewalls of the opening varies from 50 to 80 Angstrom. Moreover, in a typical deposition of the pure copper seed layer, the pure copper readily oxidizes at room temperature forming $CuO_x$. This $CuO_x$ must, during a typical creation of a copper via plug, be removed before copper plating with a Electrical Chemical Deposition (ECD) bath causing further problems of lack of repeatability in creating a uniform seed layer over the sidewall of the opening.

FIG. 1 shows a cross section of a copper plug created using Prior Art technology. A metal contact 11 is formed in a surface 10, typically the surface of a semiconductor substrate where the metal contact is part of a metal interconnect network that has been created in the surface of the substrate. Opening 18, in this case a dual damascene opening, has been created in the conventional manner in two layers of dielectric 12 and 14. A barrier layer (not highlighted for the sake of clarity) has been deposited over the sidewalls of the opening 18, a seed layer 16 of pure copper has been deposited over the barrier layer over the sidewalls of the opening 18. Area 20 is highlighted as an area where the pure copper of the seed layer 16 has oxidized and has been etched away by the ECD bath. The seed layer is, due to its oxidation, not thick enough and not uniform in molecular structure in area 20 and is etched through by the Electrical Chemical Deposition (ECD) bath. It is clear from FIG. 1b that the copper fill that is applied to opening 18 does not have the benefit of a seed layer in region 22 resulting in problems of plug reliability.

U.S. Pat. No. 5,112,448 (Chakravorty) shows a Cu plating process with a Cu seed layer in the trench.

U.S. Pat. No. 5,898,222 (Farooq et al.) teaches a Cu plating process with a seeding layer.

U.S. Pat. No. 5,462,897 (Baum et al.) teaches a method to electroplate Cu to form an interconnect by covering the seed layer with a dielectric layer.

U.S. Pat. No. 5,266,446 (Chang et al.), U.S. Pat. No. 5,436,504 (Chakravorty et al.) and U.S. Pat. No. 5,899,704 (Kwon) recite other Cu electroplating processes.

SUMMARY OF THE INVENTION

A principle objective of the invention is to provide a method that prevents oxidation of the seed layer that is deposited as part of forming a copper high aspect ratio plug.

Another objective of the invention is to improve plug fill reliability and repeatability in forming a high aspect ratio copper plug.

Yet another objective of the invention is to provide a doped copper seed layer that prevents oxidation of the deposited seed layer that is deposited as part of forming a copper high aspect ratio plug.

A still further objective of the invention is to provide a method that eliminates the need for applying an Electrical Chemical Deposition as part of creating a high aspect ratio copper plug.

Yet another objective of the invention is to provide a method of forming a uniform seed layer on the sidewalls of a via/contact opening.

In accordance with the objectives of the invention a new method is provided whereby a copper seed layer is deposited over a barrier layer of TaN. Under the first embodiment of the invention, a doped seed layer is deposited over the barrier layer. Under the second embodiment of the invention a thin layer of metal is deposited on top of a seed layer of pure copper thereby preventing oxidation of the seed layer.

DESCRIPTION OF THE PREFERRED EMBODIMENTS

Figures 1A, 1B:
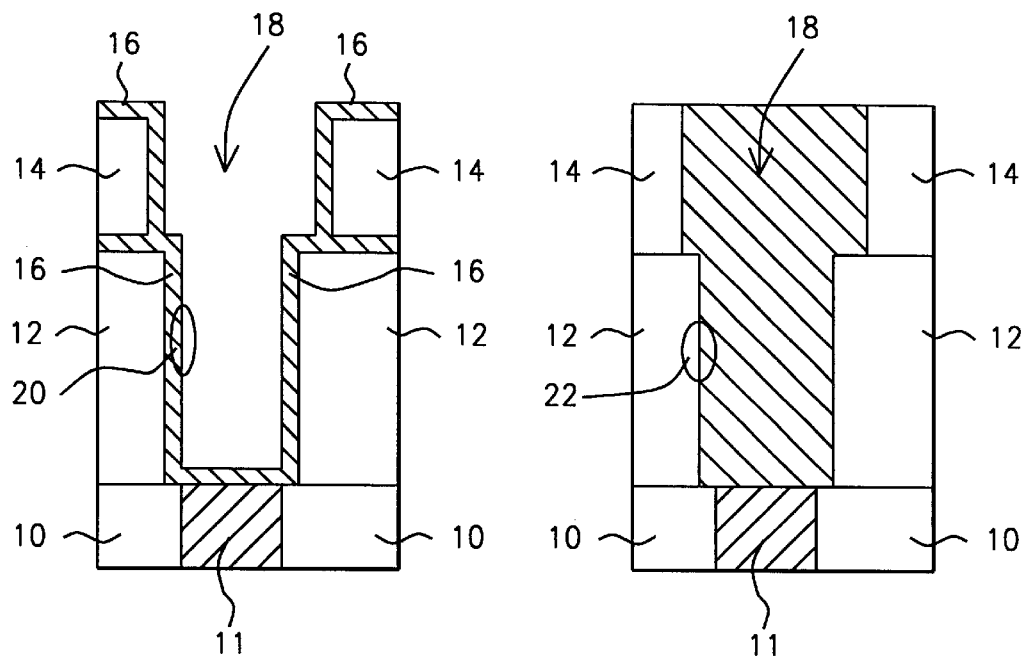
FIGS. 1a and 1b show a Prior Art method of creating a contact/via plug.
Figures 2A, 2B:
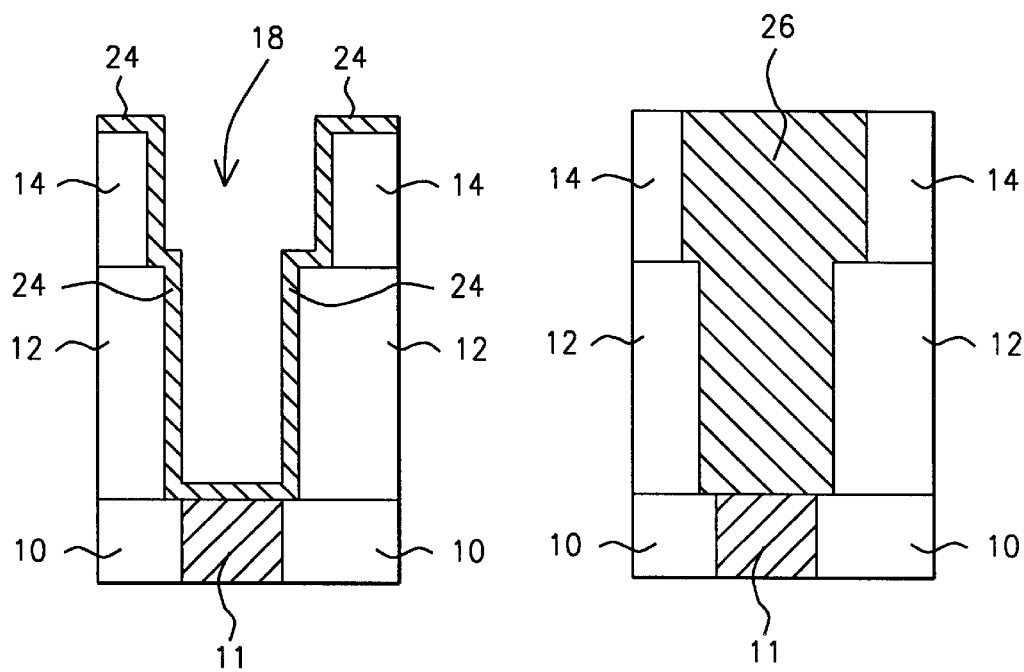
FIGS. 2a and 2b show the first embodiment of the invention where a doped layer of copper is deposited.

Referring now specifically to FIG. 2a, there is shown a cross section of a (dual damascene) opening 18 that has been formed in two layers 12 and 14 of dielectric. The plug that is to be formed in the opening 18 makes contact with a metal connect point 11 that has been formed in a surface 10. A barrier layer (not shown for reasons of clarity) has been deposited over the sidewalls of the opening 18, a seed layer 24 has been deposited over the barrier layer along the sidewalls of opening 18. The seed layer under the first embodiment of the invention contains copper mixed with a dopant M whereby M represents a dopant selected from the group consisting of Ti, Al, Zn, Zr or Mg and whereby the volume of M within the doped seed layer does not exceed 10% of the total volume of the doped layer of copper. The dopant in the seed layer prevents the oxidation of the seed layer after the seed layer has been deposited thereby leaving the surface of the seed layer intact. The molecular structure of the surface of the seed layer is not disturbed by the (typical) process of oxidation.

The processing conditions for the deposition of the seed layer 24 are as follows: a sputter chamber or an Ion Metal Plasma (IMP) chamber is used at a temperature of between about 0 and 300 degrees C. and a pressure of between about 1 and 100 mTorr, using copper or a copper alloy as the source (as highlighted above) at a flow rate of between about 10 and 400 sccm and using argon as an ambient gas.

FIG. 2b shows a cross section of the copper plug 26 after the copper has been deposited inside the opening 18, planarization of the surface of the deposited copper has also been completed. The copper has been deposited using ECD gap fill technology. It is clear from FIG. 2b that the deposition of the copper plug is not affected by irregularities in the surface of the previously deposited seed layer and therefore has uniform adhesion to the sidewalls of the opening 18 (FIG. 2b).

The processing conditions for the ECD bath are as follows: a temperature between about 10 and 50 degrees C. with a source of deposition containing $CuSO_4$, $H_2SO_4$, HCl with suitable additives at a flow rate of between about 5 and 50 slm applied for a time of between about 1 and 10 minutes with between about 0.1 and 1.0 volts applied to the anode and between about 0.1 and 1.0 volts applied to the cathode of the ECD chamber.

Figures 3A, 3B:
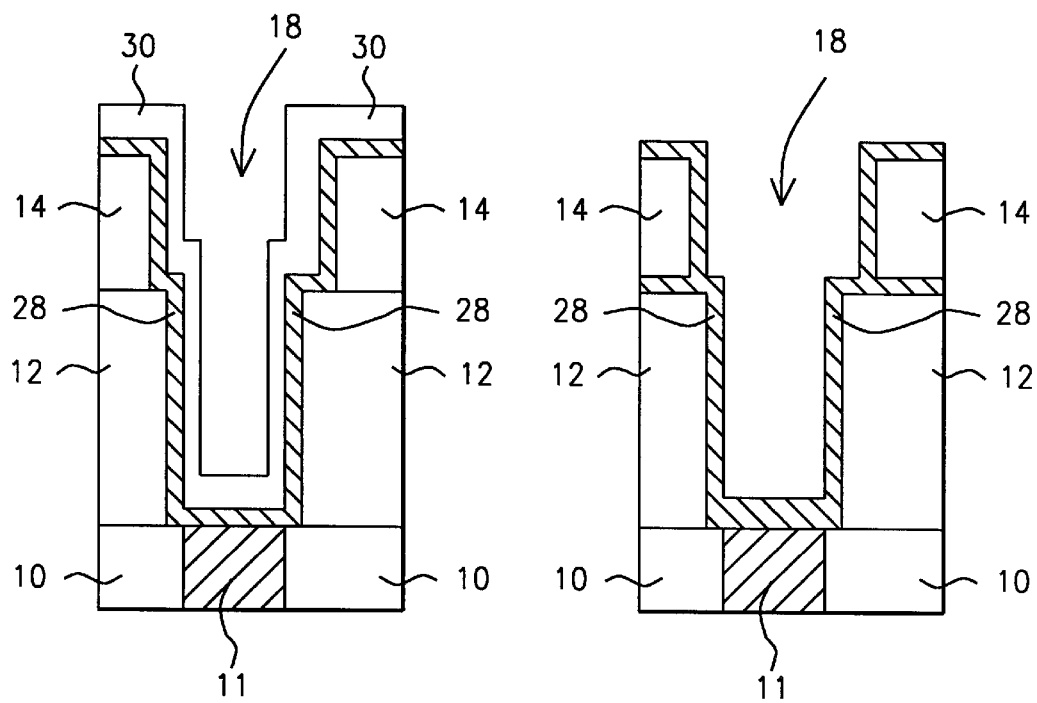
FIGS. 3a and 3b show the second embodiment of the invention where a thin layer of metal is deposited over the seed layer.

FIG. 3 addresses the second embodiment of the invention. FIG. 3a shows a cross section of an opening 18 that has been formed in two dielectrics 12 and 14. The copper plug that is to be formed in the opening 18 is to make electrical contact with the metal contact point 11 that has been created in a surface 10. A barrier layer (not shown for purposes of clarity) has been deposited over the sidewalls of opening 18, a seed layer 28 of pure copper has been deposited over the barrier layer. Over the seed layer 28 a layer 30 has been deposited, this layer 30 has the express purpose of shielding the pure copper of the seed layer 28 against oxidation. This oxidation protection or cap metal layer 30 can contain one of the elements selected from the group consisting of Zn, Co, Ni, Mg and Ca. The composition of the cap layer 30 is selected such that the cap layer 30 prevents oxidation of the underlying layer 28 of pure copper.

The processing conditions for the deposition of the CAP layer 30 are as follows: a sputter chamber or IMP chamber is used at a temperature of between about 0 and 300 degrees C. and a pressure between about 1 and 100 mTorr using as source CAP material at a flow rate of between about 10 and 400 sccm with an ambient environment of argon.

FIG. 3b shows a cross section after that cap layer 30 (FIG. 3a) has been removed from the surface of the seed layer 28. This process of removal takes place immediately prior to the step of filling the opening 18 with copper for the creation of the completed copper plug. The process of removing the cap layer 30 is performed using the ECD bath and exposes the layer 28 of pure copper that can now serve as seed layer. By placing the substrate in the ECD bath, the CAP layer is removed thereby exposing the layer 29 of pure copper.

Figure 3C:
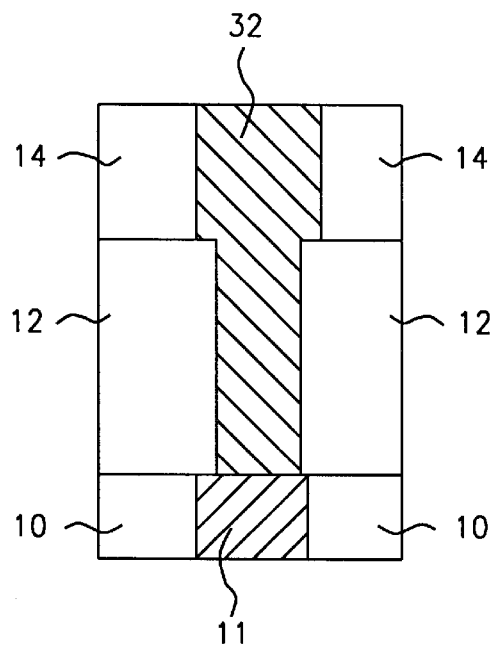

FIG. 3c shows a cross section after the copper 32 has been deposited inside opening 18 thereby completing the process of forming a via/contact plug. It is clear from FIG. 3c that, since no oxidation of the seed layer of pure copper has taken place, the copper for the copper plug that is deposited inside opening 18 can now make contact with and adhere to a surface of undisturbed molecular structure. Potential reliability problems, caused by oxidation of the copper seed layer, are therefore eliminated.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of preventing seed layer oxidation, consisting of:

creating an opening in a surface of a semiconductor device;

depositing a seed layer over inside surfaces of said opening;

depositing a thin layer of metal over the surface of said seed layer, said seed layer being a layer of pure copper;

removing said thin layer of metal from the surface of said seed layer; and filling said opening with a metal thereby forming an electrical contact or via.

2. The method of claim 1 wherein said opening is a high aspect ratio contact or via opening.

3. A method of preventing seed layer oxidation, consisting of:

creating an opening in a surface of a semiconductor device;

depositing a seed layer over the inside surfaces of said opening;

depositing a thin layer of metal over the surface of said seed layer, said thin layer of metal comprising one of the elements selected from a group comprising Zn, Co, Ni, Mg and Ca;

removing said thin layer of metal from the surface of said seed layer; and filling said opening with a metal thereby forming an electrical contact or via.

4. A method of preventing seed layer oxidation, consisting of:

creating an opening in a surface of a semiconductor device;

depositing a seed layer over the inside surfaces of said opening;

depositing a thin layer of metal over the surface of said seed layer;

removing said thin layer of metal from the surface of said seed layer, said removing said thin layer of metal from the surface of said seed layer is processing said thin layer of metal in a ECD bath, removing said thin layer of metal, furthermore exposing the surface of said pure copper seed layer; and filling said opening with a metal thereby forming an electrical contact or via.

5. The method of claim 1 wherein said filling said opening with a metal is a ECD gap fill process thereby creating an electrical contact or via.

6. The method of claim 1 wherein said filling said opening with a metal is filling said opening with copper.

7. The method of claim 1 with the additional step of depositing a barrier layer over the inside surfaces of said opening said additional step to take place prior to said step of depositing said seed layer.

8. A method of preventing seed layer oxidation, consisting of:

creating a high aspect ratio contact or via opening in a surface of a semiconductor device;

depositing a seed layer of pure copper over the inside surfaces of said opening;

depositing a thin layer of metal over the surface of said seed layer wherein said thin layer of metal contains one of the elements selected from the group of Zn, Co, Ni, Mg and Ca;

removing said thin layer of metal from the surface of said pure copper seed layer thereby exposing the surface of said pure copper seed layer; and filling said opening with copper thereby forming an electrical contact or via.

9. The method of claim 8 wherein said removing said thin layer of metal from the surface of said pure copper seed layer is performed immediately prior to said filling said opening with a metal.

10. The method of claim 8 with the additional step of depositing a barrier layer over the inside surfaces of said opening said additional step to take place prior to said step of depositing said seed layer of pure copper.

11. The method of claim 3, said opening being a high aspect ratio contact or via opening.

12. The method of claim 3, said filling said opening with a metal being an ECD gap fill process, creating an electrical contact or via.

13. The method of claim 3, said filling said opening with a metal is filling said opening with copper.

14. The method of claim 3 with the additional step of depositing a barrier layer over inside surfaces of said opening, said additional step taking place prior to said step of depositing said seed layer.

15. The method of claim 4, said opening being a high aspect ratio contact or via opening.

16. The method of claim 4, said filling said opening with a metal being an ECD gap fill process, creating an electrical contact or via.

17. The method of claim 4, said filling said opening with a metal is filling said opening with copper.

18. The method of claim 4 with the additional step of depositing a barrier layer over inside surfaces of said opening, said additional step taking place prior to said step of depositing said seed layer.

* * * * *